(12) United States Patent
Skotnicki et al.

(10) Patent No.: US 8,693,165 B2
(45) Date of Patent: Apr. 8, 2014

(54) ELECTRICAL ENERGY GENERATION DEVICE

(75) Inventors: Thomas Skotnicki, Crolles (FR); Stéphane Monfray, Eybens (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 310 days.

(21) Appl. No.: 13/332,124

(22) Filed: Dec. 20, 2011

(65) Prior Publication Data
US 2012/0153905 A1    Jun. 21, 2012

(30) Foreign Application Priority Data
Dec. 20, 2010   (FR) .................................... 10 60858

(51) Int. Cl.
*H01G 4/38*     (2006.01)
*H01G 9/00*     (2006.01)
*H01G 2/08*     (2006.01)

(52) U.S. Cl.
CPC .............. *H01G 9/0003* (2013.01); *H01G 2/08* (2013.01); *H01G 9/155* (2013.01)
USPC ........... 361/328; 361/502; 361/504; 361/512; 361/301.5; 361/530

(58) Field of Classification Search
CPC ........ H01G 9/0003; H01G 2/08; H01G 9/155
USPC ................. 361/238, 230, 502–504, 509–512, 361/516–519
See application file for complete search history.

(56) References Cited

U.S. PATENT DOCUMENTS

| 4,441,067 | A | 4/1984 | O'Hare | |
|---|---|---|---|---|
| 4,745,278 | A | 5/1988 | Hanson | |
| 8,101,293 | B2 * | 1/2012 | Chan et al. | 429/62 |
| 8,149,568 | B2 * | 4/2012 | Lai et al. | 361/502 |
| 8,194,393 | B2 * | 6/2012 | Inoue et al. | 361/328 |
| 8,378,558 | B2 * | 2/2013 | Skotnicki | 310/339 |

FOREIGN PATENT DOCUMENTS

| DE | 1184828 B | 1/1965 |
|---|---|---|
| DE | 1231774 B | 1/1967 |

* cited by examiner

*Primary Examiner* — Nguyen T Ha
(74) *Attorney, Agent, or Firm* — Seed IP Law Group PLLC

(57) ABSTRACT

A device for generating electrical energy from the heat dissipated by a heat source, comprising: a capacitor comprising two electrodes between which a ferroelectric material is present, said capacitor being arranged so as to be positioned to capture all or part of the heat dissipated by said heat source; a capacitive element a first electrode of which is connected to a first electrode of said capacitor; a recovery circuit interposed between the second electrode of said capacitor and the second electrode of the capacitive element, and able to have the current flowing between said second electrodes pass through it. a mechanism adapted to move the capacitor with respect to the heat source, said mechanism having at least one arm able to move between two positions, the capacitor being closer to the heat source in one of the two positions.

18 Claims, 3 Drawing Sheets

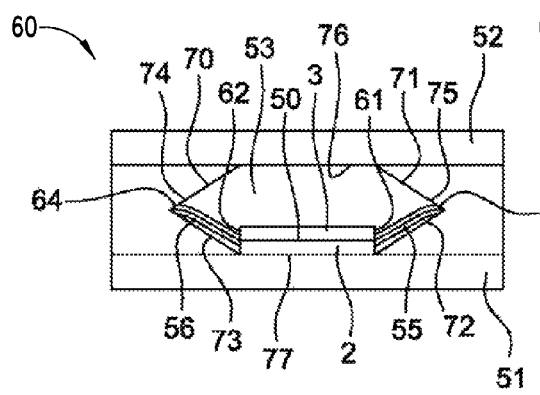
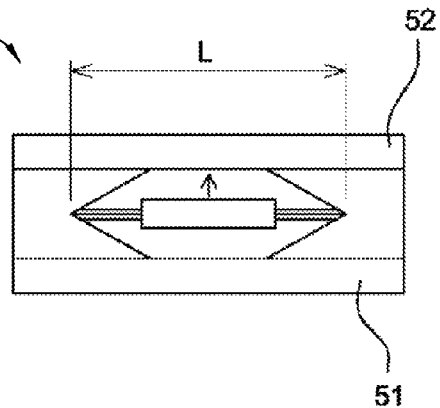
Fig. 4   Fig. 5
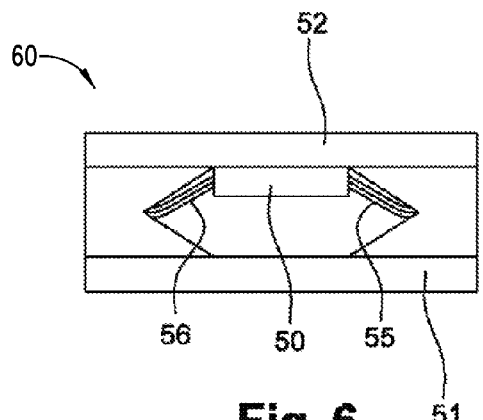
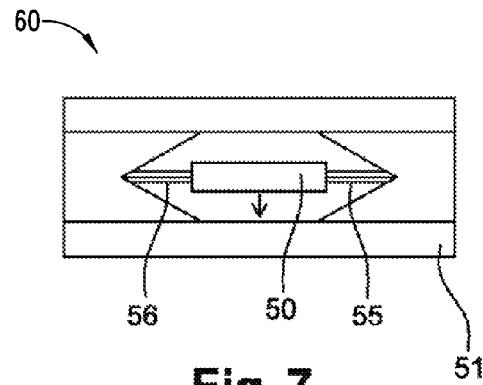
Fig. 6   Fig. 7

ELECTRICAL ENERGY GENERATION DEVICE

BACKGROUND

1. Technical Field

The present disclosure concerns an energy recovery device enabling energy available in the form of heat to be converted into electrical energy.

It finds a particular but not exclusive application in the field of electronics, enabling energy dissipated by components or electronic circuits to be recovered. In the remainder of the description, it will be described in a more detailed manner for this application, but it can also be associated with various other heat sources (such as for example boilers, industrial equipment, motors, etc.) and can be combined in general terms with any energy recovery device, for example solar, vibratory or thermal energy recovery devices.

2. Description of the Related Art

In general terms, electronic systems, in particular electronic components, give rise to electric currents that by Joule effect cause dissipation of energy in the form of heat.

This dissipation of energy reduces the efficiency of the components and it is desirable to recover all or part of this energy in order to improve the energy balance of a system incorporating electronic components.

Various solutions have already been proposed, which function on different physical principles.

Thus systems have been described using so-called "thermoacoustic" engines, which convert an air flow in contact with the heat source into a standing mechanical wave. This mechanical wave is then applied to a piezoelectric system, which thus delivers energy in electrical form.

Such systems seem difficult to optimize and are apparently not really compatible with use in the microelectronic field, where scale factors impose sizing constraints.

In addition, systems are also known that function on the principle of electromechanical turbines. The heat captured is used to cause a change in phase of a fluid, the gaseous phase of which drives a rotary part, which is itself connected to an electromechanical generator thus delivering energy of the electrical type.

Such systems generally have low efficiency and are the source of wear, due to the fact that the energy recovery is related to the movement of rotary parts, and are especially difficult to miniaturize.

Systems are also known that function using thermoelectrical effects, or Seebeck effect. These devices have the advantage of having no moving mechanical parts. However, in order to obtain satisfactory efficiency, the choice of materials able to generate this thermoelectric effect is relatively small. These materials are generally not very compatible with the constraints imposed in the methods used in microelectronics, for producing components based on semiconductor materials.

BRIEF SUMMARY

It would therefore be desirable to be able to benefit from energy recovery devices that have satisfactory efficiency, while being compatible with the technologies used for producing electronic components, in order to be able to integrate the energy recovery devices with the electronic components more or less closely, or to combine them in general terms with any energy recovery devices, for example solar, vibratory or thermal energy recovery devices.

It would also be useful for the energy recovery device to have operating modes in which the number of movable parts is minimum, in order not to suffer wear.

One embodiment of the disclosure is a device for generating electrical energy from the heat dissipated by a heat source that comprises:

a capacitor comprising two electrodes between which a ferroelectric material is present, this capacitor being able to capture all or part of the energy dissipated by the heat source;

a capacitive element a first electrode of which is connected to a first electrode of said capacitor;

a recovery circuit interposed between the second electrode of the capacitor and the second electrode of the capacitive element, this circuit being able to have the current flowing between the second electrodes pass through it; and a mechanism adapted for moving the capacitor including the ferroelectric material with respect to the heat source, said mechanism having at least one arm able to move between two positions, the capacitor including the ferroelectric material being closer to the heat source in one of the two positions.

Such a movement therefore positively ensures a variation in the temperature of the ferroelectric material of the capacitor in the case where the dissipation of energy by the heat source is constant. Thus, when the capacitor undergoes a variation in temperature, its electrical permittivity varies, and a circulation of charges appears between this capacitor and the other capacitive element that is connected thereto in parallel.

In a particular embodiment, the first electrode of the capacitor and the first electrode of the capacitive element may be merged, and thus be formed by a common metal layer.

In a specific embodiment, the capacitor including the ferroelectric material and the capacitive element may be superimposed, and advantageously share an electrode.

According to a particular embodiment, the ferroelectric material of the capacitor may be separated from the electrodes of the capacitor by one or more layers of dielectric materials.

In a particular embodiment, the arms of this mechanism may consist of bimetallic strips so that the heat dissipated by the heat source causes the deformation of the bimetallic strips without the addition of any external energy other than the heat absorbed by the bimetallic strips.

However, it is also possible for the movement of the arms to be caused by a particular actuator, using a specific energy source, which may for example be supplied by the recovery of energy effected by the ferroelectric-material capacitor.

Advantageously, the two positions between which the arms of the mechanism move are the only two stable equilibrium positions of the assembly, so that the capacitor is for the majority of the time situated in one of the two equilibrium positions, either close to or further away from the heat source.

In a favored embodiment, the Curie point of the ferroelectric material is situated between the temperature of the heat source and the ambient temperature prevailing in the space where the capacitor moves.

In other words, advantage can be taken of the fact that, in the operating cycle thereof, the temperature of the ferroelectric material varies while passing through the Curie point, at which the dielectric permittivity thereof reaches a maximum.

Advantageously, the device may comprise a charge circuit adapted to transfer an electrical charge to the capacitor or to the capacitive element, and in particular to compensate for leakage phenomena.

In practice, the energy generation device may be used individually, or be collected together by subassemblies of matrices of capacitors/capacitive elements, with a set of connections for recovering, in a common and global fashion, the energy generated.

BRIEF DESCRIPTION OF THE SEVERAL VIEWS OF THE DRAWINGS

Certain features of the disclosure, as well as the advantages that result therefrom, will emerge clearly from the following description of embodiments, with the help of the accompanying figures given by way of non-limitative example, and in which:

FIGS. 4 to 7 are views in schematic section of a generation device integrating a mechanism for movement with respect to the heat source, shown according to four steps of an operating cycle;

Naturally the forms and dimensions of the elements shown in the figures have been chosen to facilitate understanding of the disclosure and may be exaggerated or may differ from reality.

DETAILED DESCRIPTION

Figure 1:
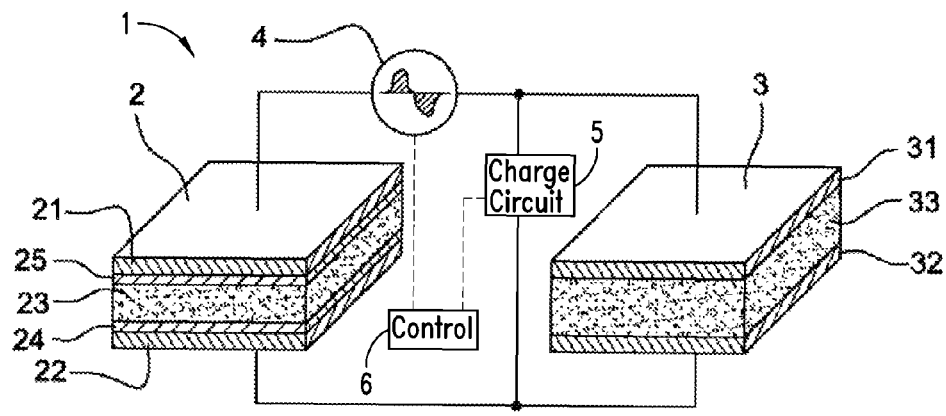
FIG. 1 is a diagram in summary perspective showing an energy recovery device according to a first embodiment.

As illustrated in FIG. 1, an electrical energy generation device 1 comprises a capacitor 2, a capacitive element 3 and a recovery circuit 4, interposed between an electrode 21 of the capacitor 2 and an electrode 31 of the capacitive element 3.

More precisely, the capacitor 2 has two electrodes 21, 22 facing each other. Between these electrodes 21, 22, a layer 23 made from a ferroelectric material is present. This ferroelectric material may for example be barium titanate ($BaTiO_3$) or lead titanate ($PbTiO_3$), or more generally other ferroelectric oxides with a perovskite structure.

In the form illustrated in FIG. 1, the ferroelectric material present in the capacitor 2 is isolated from the electrodes 21, 22 by dielectric layers 24, 25. Such an arrangement prevents contact between the ferroelectric material 23 and the metal of the electrodes 21, 22, which may be advantageous vis-à-vis the manufacturing method.

However, these isolation layers may not be necessary according to certain technological choices.

The capacitive element 3 for its part is of traditional design, that is to say it has a dielectric material 33 separating these electrodes 31, 32 that has an electrical permittivity that does not vary with the temperature or in any event to a much lesser extent than that of the ferroelectric material 23.

As illustrated in FIG. 1, the capacitor and the capacitive element 3 are connected together. More precisely, a first electrode 22 of the capacitor 2 is connected directly to a first electrode 32 of the capacitive element 3. Complementarily, the second electrode 21 of the capacitor 2 is connected to the recovery circuit 4, which is itself connected to the second electrode 31 of the capacitive element 3.

A charge circuit 5 is also connected to the interconnected electrodes 22, 32 and to the second electrode 31 of the capacitive element (in the form illustrated, or of the capacitor in a form that is not illustrated). This charge circuit 5 makes it possible to charge the capacitor 2 and the capacitive element 3 in a controlled fashion, or at any time during functioning when desired.

The energy generation device 1 also includes a control device 6 is associated with the capacitor 2, capacitive element 3, recovery circuit 4, and charge circuit 5 so as to provide, at the opportune moment, recharging of the capacitive element and of the capacitor, when the charging level, and therefore the voltage, falls below a predefined threshold, because of the leakage phenomena occurring through the dielectric and ferroelectric materials.

Thus, in operating mode, when the capacitor 2 and the capacitive element 3 are charged, the connection between the respective first 22, 32 and second 21, 31 electrodes thereof means that the voltage that prevails between the electrodes thereof is constant.

The capacitor 2 is disposed at a point that enables it to capture all or part of the heat from a heat source. It may be a positioning in contact with the heat source, so that the heat is transmitted by conduction and possibly by radiation. The device, and in particular the capacitor 2, can also be situated at a certain distance so that the heat reaches it by convection and/or radiation also.

Complementary arrangements can also be employed to enable heat to be routed from the heat source to the capacitor without the latter having to be in direct proximity to the heat source, provided that the transfer of heat is ensured.

Figure 2:
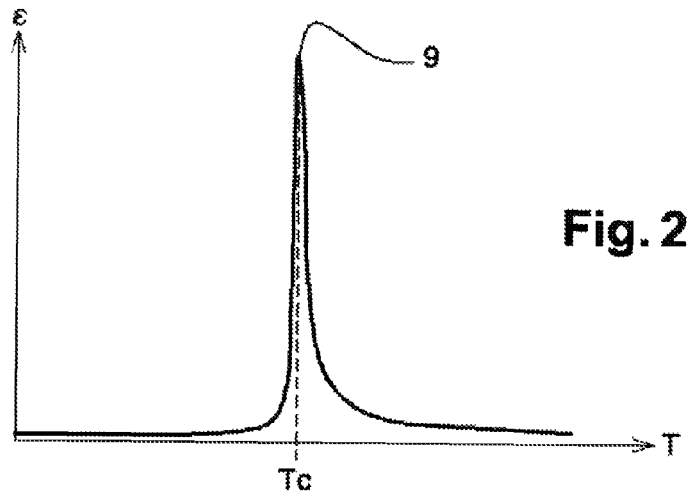
FIG. 2 is a curve illustrating the variation in the electrical permittivity of a ferroelectric material as a function of temperature.

The disclosure uses the properties of ferroelectric materials, which have electrical permittivity that varies with temperature, as illustrated in FIG. 2.

This is because a ferroelectric material has specific biasing properties below a temperature referred to as the Curie point $T_c$. Beyond this temperature, the material loses its ferroelectric properties and is situated in a paraelectrical phase.

As illustrated in FIG. 2, the electrical permittivity of such a material has a marked peak 9 at the Curie point $T_c$.

The functioning of the device can be summarized as follows.

When the capacitor 2 and the capacitive element 3 are charged by activation of the charge circuit 5, the same voltage then prevails between the electrodes 21, 22, 31, 32 thereof, except for the difference of the voltage at the terminals of the recovery circuit 4.

At a given temperature value, the ferroelectric material has a corresponding permittivity, and the capacitor then has a given capacitance C1. The charges present on the electrodes of the capacitor 2 and of the capacitive element 3 are distributed in proportion to their respective capacitances.

When the temperature of the ferroelectric material of the capacitor 2 changes, its electrical permittivity varies, and the capacitance of the capacitor 2 also changes. The distribution of charges between the capacitor 2 and the capacitive element changes accordingly.

As a result a current is generated between the second electrode 21 of the capacitor 2 and the second electrode 31 of the capacitive element 3.

The variation in the capacitance of the capacitor 2 is all the greater when, during variation thereof, the temperature of the ferromagnetic material passes through the Curie point, where the material has maximum electrical permittivity.

This is why, as far as possible, a ferroelectric material will be chosen that has its Curie point close to the operating temperature of the system to which the energy generation device is added.

By way of example, ferroelectric materials based on barium titanate or lead titanate have a Curie point between 100° and 120° C., which correspond substantially to the temperature recorded in traditional electronic components, in conventional functioning.

Figure 3:
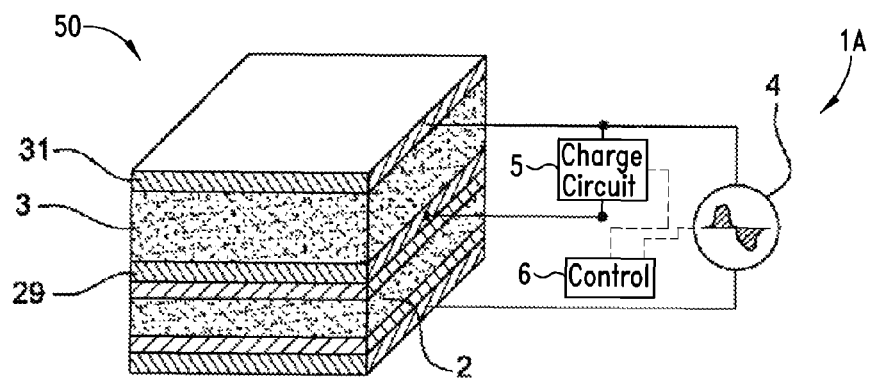
FIG. 3 is a diagram in summary perspective illustrating an electrical energy generation device according to one embodiment.

An embodiment illustrated in FIG. 3 is an electrical energy conversion device 1A that includes a capacitive subassembly 50 coupled to the energy recovery circuit 4, the charge circuit 5, and the controller 6. The capacitive subassembly 50 includes the capacitor 2, including the ferroelectric material 23, and the capacitive element 3 positioned in a superimposed manner, so that they share their common electrode 29. The two electrodes situated above and below the stack are electrodes between which the recovery circuit is interposed.

Such a configuration can advantageously be employed in the embodiment illustrated in FIGS. 4 to 7.

In particular, FIGS. 4-7 show a capacitive assembly 60 that includes the subassembly 50, including the ferroelectric capacitor 2 and the capacitive element 3, inserted inside a housing 53 formed between two walls 51, 52. A first wall 51 may for example be in contact with the heat source, while the second wall 52 is in contact with the ambient environment, or more generally with an environment at a temperature different from the heat source. In this configuration, the capacitor including the ferroelectric material will preferably be arranged in the lower part of the subassembly 50, so that it is as close as possible to the heat source. The capacitive assembly 60 of FIGS. 4-7 would also be coupled to the energy recovery circuit 4, the charge circuit 5, and the controller 6 to form the complete electrical energy generation device 1A.

Between these two walls 51, 52, the housing 53 has a cross section (measured parallel to the walls) that increases up to half way up and then decreases as far as the opposite wall.

Inside this housing 53, the assembly 50 formed by the capacitor and the capacitive element is held by two arms 55, 56. Each arm 55, 56 has an end 61, 62 that comes into contact with the capacitor/capacitive element assembly 50, and an opposite end 63, 64 that bears at the bottom 74, 75 of the region with the highest cross section, that is to say in the region where the inclined flanks 70, 71, 72, 73 of the housing form a ridge. These arms can also support the electrical connections of the capacitor and of the capacitive element to the recovery circuit and to the charge circuit.

Advantageously, the flanks 70-73 intersect the top 52 and bottom 51 walls so that they leave clear on these walls a space 76, 77 at least as wide as the capacitor/capacitive element assembly 50 so that the capacitor 2 comes into direct contact over its entire surface with the wall thermally connected to the heat source.

Preferably, the length of the arms 55, 56 is such that, when the capacitor/capacitive assembly 50 is in contact with the bottom wall 51, the arms are held under stress, so that this position constitutes a stable mechanical equilibrium position.

Conversely, a movement of the capacitor/capacitive element assembly 50 in the direction of the opposite wall 52 involves buckling of the arms 55, 56. In other words, the width L of the housing, measured half way up, that is to say between the ridges 63, 64, is less than the sum of the length of the arms 55, 56 and the width of the capacitor/capacitive element assembly 50.

In practice, the arms 55, 56 can advantageously be produced from two materials having different thermal expansion coefficients, so as to form bimetallic strips. These may for example be two metal materials, or a metal material such as aluminum combined with a polysilicon layer.

From the point of view of the manufacture thereof, the arms and the capacitive element can be produced during a method concatenating successive steps of creation of various layers forming both the capacitor and the capacitive element and the bimetallic strips, as well as the walls of the housing.

It is also possible for the whole of the energy generation device to be produced by assembling parts formed individually.

Thus, as illustrated in FIG. 4, when the capacitor/capacitive element assembly 50 is in a position closest to the heat source, the capacitor 2, and in particular the ferroelectric material that it contains, are at a given temperature $T_1$. The heat dissipated by the heat source causes a rise in temperature of the arms 55, 56, and therefore differential expansion of the two layers that constitute them.

When the temperature of the arms 55, 56 reaches a predetermined level, the arms deform as illustrated in FIG. 5.

The dimensional properties of the arms 55, 56 and of the capacitor/capacitive element assembly 50 mean that the deformation of the bimetallic strips by thermal phenomena put the arms 55, 56 under buckling stress.

Consequently the position illustrated in FIG. 5 is not a stable mechanical equilibrium position. The movement therefore continues as far as the configuration illustrated in FIG. 6, in which the arms 55, 56 are no longer stressed under buckling.

The capacitor/capacitive element assembly 50 is then in contact with the opposite wall 52 or more generally at a distance from the heat source such that the temperature that prevails therein is less than that to which the capacitor 2 is subjected in the configuration in FIG. 4.

At this stage therefore, the temperature of the ferroelectric material decreases, resulting in a change in its electrical permittivity and therefore the appearance of an electric current that the recovery circuit 4 mentioned above routes to an electrical energy storage device.

Subsequently, the temperature of the arms 55, 56 also decreases, so that the bimetallic strips deform in the opposite direction. After a certain time, the capacitor/capacitive element assembly 50 leaves its stable equilibrium position for a movement illustrated in FIG. 7.

Symmetrically with the movement in FIG. 5, the capacitor/capacitive element assembly 50 ends up in the other stable equilibrium position, corresponding to the configuration in FIG. 4.

By way of example, the order of magnitude of the capacitance of a capacitive element of 1 µF corresponds substantially to the capacitance of a one-square-centimeter MOS capacitor, with a layer of dielectric material of the $SiO_2$ type four nanometers thick. For an initial voltage at the terminals of the capacitor 2 and of the capacitive element 3 of around 5 volts, and assuming that the capacitance of the capacitor varies between that of the capacitive element and twice this value, the mean current that flows between the electrodes 21, 31 of the capacitor 2 and of the capacitive element 3 is around one microampere. The mean power that can thus be recovered is around a few microwatts, assuming a cycle lasting for one second.

Figure 8:
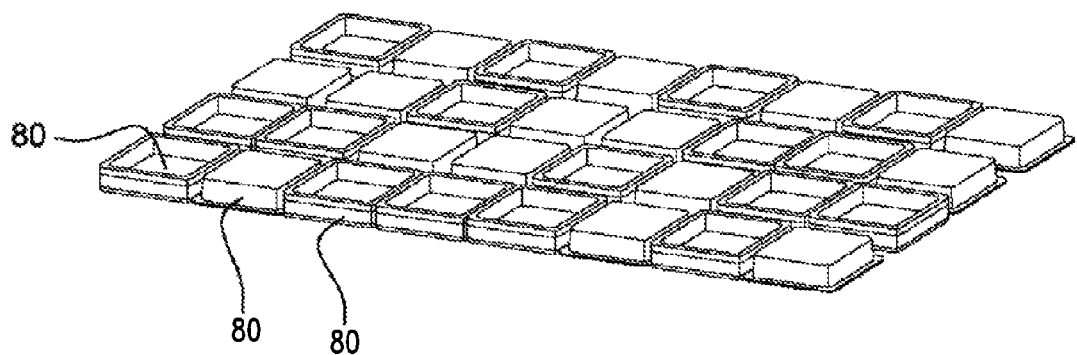
FIG. 8 is a view in schematic summary perspective of a set of electrical energy generation devices.

The electrical energy generation device 1, 1A described above may be used in various ways and in particular as illustrated in FIG. 8, by creating a matrix of elementary cells 80. In one embodiment, each of the elementary cells 80 can be implemented by one of the capacitive assemblies 60 as described in FIGS. 4 to 7.

These elementary cells, may, in one embodiment, be combined so that they supply a common charge such as for example a common energy storage member.

Naturally, this device can be used in many applications. It can in particular be integrated in or associated with electronic components so as to provide superior autonomy or operating life by virtue of the recovery of part of the energy dissipated in the form of heat. It may also be associated with various other heat sources that may encountered in the transport field, automobiles in particular.

This device can also be combined with solar energy recovery systems, or in general terms any thermal energy recovery device.

Figure 9:
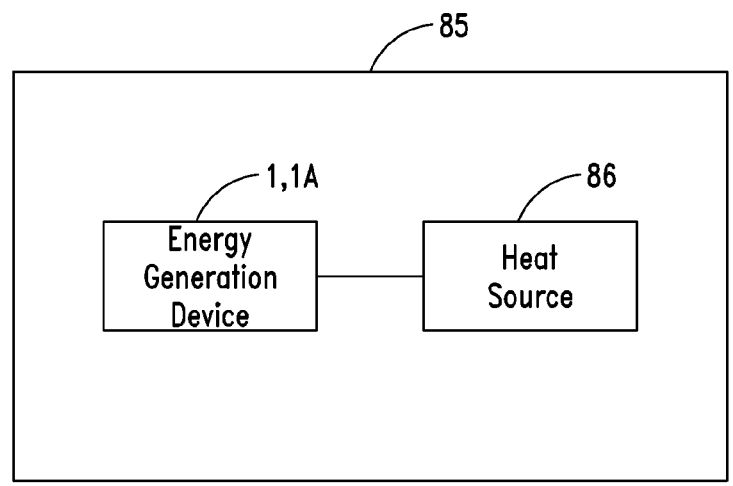
FIG. 9 is a block diagram of a device that includes a heat source and an electrical energy generation device according to one embodiment of the disclosure.

FIG. 9 is a block diagram of a device 85 that includes a heat source 86 that is in contact with or adjacent to an electrical energy generation device that could be implement using either of the embodiments 1, 1A discussed above.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for generating electrical energy from heat from a heat source, comprising:
    a first capacitor that includes first and second electrodes and a ferroelectric material between the electrodes, said first capacitor being configured to capture all or part of the heat from said heat source;
    a first capacitive element having first and second electrodes, the first electrode being coupled to the first electrode of said first capacitor;
    a recovery circuit interposed between the second electrode of said capacitor and the second electrode of the first capacitive element, and configured to receive current flowing between said second electrodes; and
    a first mechanism configured to move the first capacitor with respect to the heat source, said first mechanism having an arm configured to move between first and second positions, the first position being closer to the heat source that the second position.

2. The device as claimed in claim 1, wherein the first electrode of the first capacitor and the first electrode of the first capacitive element are merged.

3. The device as claimed in claim 2, wherein the first capacitor and the first capacitive element are positioned on each other.

4. The device as claimed in claim 1, wherein the first capacitor includes a dielectric layer positioned between the ferroelectric material and one of the electrodes of the first capacitor.

5. The device as claimed in claim 1 wherein the arm is a bimetallic strip.

6. The device as claimed in claim 1, wherein the first and second positions of said arm are the only two stable equilibrium positions.

7. The device as claimed in claim 1, wherein the ferroelectric material has a Curie point situated between a temperature of the heat source and an ambient temperature prevailing in space in which the first capacitor moves.

8. The device as claimed in claim 1, comprising a charge circuit configured to transfer an electrical charge to the first capacitor.

9. The device as claimed in claim 1, wherein the first capacitor, first capacitive element, and first mechanism comprise a first capacitive assembly of a matrix of capacitive assemblies, each capacitive assembly other than the first capacitive assembly including:
    a second capacitor that includes first and second electrodes and a ferroelectric material between the electrodes, said second capacitor being configured to capture part of the heat from said heat source;
    a second capacitive element having first and second electrodes, the first electrode being coupled to the first electrode of said second capacitor; and
    a second mechanism configured to move the second capacitor with respect to the heat source, said second mechanism having an arm configured to move between first and second positions, the first position being closer to the heat source that the second position.

10. A device, comprising:
a heat source; and
an electrical energy generation device that includes:
    a first capacitor that includes first and second electrodes and a ferroelectric material between the electrodes, said first capacitor being configured to capture all or part of the heat from said heat source;
    a first capacitive element having first and second electrodes, the first electrode being coupled to the first electrode of said first capacitor;
    a recovery circuit interposed between the second electrode of said capacitor and the second electrode of the first capacitive element, and configured to receive current flowing between said second electrodes; and
    a first mechanism configured to move the first capacitor with respect to the heat source, said first mechanism having an arm configured to move between first and second positions, the first position being closer to the heat source that the second position.

11. The device as claimed in claim 10, wherein the heat source is an electronic component.

12. The device as claimed in claim 10, wherein the first capacitor and the first capacitive element are positioned on each other and the first electrode of the first capacitor and the first electrode of the first capacitive element are merged.

13. The device as claimed in claim 10, wherein the first capacitor includes a dielectric layer positioned between the ferroelectric material and one of the electrodes of the first capacitor.

14. The device as claimed in claim 10, wherein the arm is a bimetallic strip.

15. The device as claimed in claim 10, wherein the first and second positions of said arm are the only two stable equilibrium positions.

16. The device as claimed in claim 10, wherein the ferroelectric material has a Curie point situated between a temperature of the heat source and an ambient temperature prevailing in space in which the first capacitor moves.

17. The device as claimed in claim 10, comprising a charge circuit configured to transfer an electrical charge to the first capacitor.

18. The device as claimed in claim 10, wherein the first capacitor, first capacitive element, and first mechanism comprise a first capacitive assembly of a matrix of capacitive assemblies, each capacitive assembly other than the first capacitive assembly including:

a second capacitor that includes first and second electrodes and a ferroelectric material between the electrodes, said second capacitor being configured to capture part of the heat from said heat source;
a second capacitive element having first and second electrodes, the first electrode being coupled to the first electrode of said second capacitor; and
a second mechanism configured to move the second capacitor with respect to the heat source, said second mechanism having an arm configured to move between first and second positions, the first position being closer to the heat source that the second position.

* * * * *